United States Patent
Gao

(10) Patent No.: US 9,887,214 B2
(45) Date of Patent: Feb. 6, 2018

(54) ARRAY SUBSTRATE, METHOD FOR REPAIRING DISCONNECTION OF DATA LINE ON ARRAY SUBSTRATE, AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventor: Yingqiang Gao, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/136,186

(22) Filed: Apr. 22, 2016

(65) Prior Publication Data

US 2016/0370666 A1 Dec. 22, 2016

(30) Foreign Application Priority Data

Jun. 18, 2015 (CN) .......................... 2015 1 0341541

(51) Int. Cl.
*H01L 27/14* (2006.01)
*H01L 21/00* (2006.01)
(Continued)

(52) U.S. Cl.
CPC ...... *H01L 27/124* (2013.01); *G02F 1/136259* (2013.01); *G02F 1/134363* (2013.01); *G02F 2001/136263* (2013.01)

(58) Field of Classification Search
CPC ......... G02F 1/134309; G02F 1/136286; G02F 1/1368; G02F 1/136259;
(Continued)

(56) References Cited

U.S. PATENT DOCUMENTS 6,441,401 B1 8/2002 Jung et al.
2008/0100764 A1* 5/2008 Haruyama ........ G02F 1/133555
349/43
2008/0135857 A1* 6/2008 Kim .................. G02F 1/136259
257/88

FOREIGN PATENT DOCUMENTS

CN 101202287 A 6/2008
KR 20050105591 A 11/2005

OTHER PUBLICATIONS

Office Action dated Jul. 5, 2017 issued in corresponding Chinese Application No. 201510341541.5.

* cited by examiner

*Primary Examiner* — Julio J Maldonado
*Assistant Examiner* — Stanetta Isaac
(74) *Attorney, Agent, or Firm* — Nath, Goldberg & Meyer; Joshua B. Goldberg

(57) ABSTRACT

An array substrate, a method for repairing disconnection of the data line and a display device are disclosed. The array substrate is divided into a plurality of pixel regions by data lines and gate lines, each pixel region is provided with a thin-film transistor and a pixel electrode, a gate of the thin-film transistor is connected to the gate line, a source is connected to the data line, a drain is connected to the pixel electrode. The array substrate further comprises a common electrode line, which includes a common electrode line mainbody disposed in parallel to the gate line, common electrode line branches extending along a direction of the data line and disposed at both sides of the data line, and common electrode line bridges between the common electrode line branches, the common electrode line bridges and the data line intersect each other and are insulated from each other.

18 Claims, 3 Drawing Sheets

(51) Int. Cl.
*H01L 27/12* (2006.01)
*G02F 1/1362* (2006.01)
*G02F 1/1343* (2006.01)

(58) Field of Classification Search
CPC .......... G02F 2001/136263; G02F 2001/13629;
G02F 2001/134318; G02F 27/1214; H01L
27/124; G09G 3/3655; G09G 2300/0876;
G09G 2300/043
See application file for complete search history.

ARRAY SUBSTRATE, METHOD FOR REPAIRING DISCONNECTION OF DATA LINE ON ARRAY SUBSTRATE, AND DISPLAY DEVICE

CROSS-REFERENCE TO RELATED APPLICATION

This application claims priority to Chinese Patent Application No. 201510341541.5, filed on Jun. 18, 2015, the contents of which are incorporated by reference in the entirety.

FIELD OF THE INVENTION

The present invention relates to the field of display technology, and particularly, relates to an array substrate, a method for repairing disconnection of data line on the array substrate, and a display device.

BACKGROUND OF THE INVENTION

Generally, existing flat panel display device includes an array substrate for controlling pixel display by controlling on/off of each pixel through thin-film transistors distributed over every pixel region in the meantime, as to TN mode liquid crystal display products, the array substrate further includes a common electrode line (COM) for providing a common reference voltage for pixel display. As shown in FIG. 1, the common electrode line 4 in existing TN mode array substrate has a fork shape, and includes a portion parallel to a gate line and a portion extending downward along a data line direction. A total resistance of the common electrode line 4 is great, which reduces an overall uniformity of the common electrode voltage Vcom. Besides, the common electrode line does not have a function for repairing disconnection of the data line, which cannot provide advantageous effects for improving the yield of the array substrate.

SUMMARY OF THE INVENTION

In view of the above shortcomings in the prior art, the embodiments of the invention provide an array substrate, a method for repairing disconnection of data line on the array substrate, and a display device. The array substrate has a good overall uniformity of the common electrode voltage Vcom, and has a function for repairing disconnection of the data line.

The embodiment of the invention provides an array substrate divided into a plurality of pixel regions by data lines and gate lines intersecting each other and insulated from each other, each pixel region is provided with a thin-film transistor and a pixel electrode therein, a gate of the thin-film transistor is connected to the gate line, a source of the thin-film transistor is connected to the data line, and a drain of the thin-film transistor is connected to the pixel electrode, wherein the array substrate further comprises a common electrode line, the common electrode line includes a common electrode line mainbody disposed in parallel to the gate line, common electrode line branches extending along a direction of the data line and disposed at both sides of the data line, and common electrode line bridges between the common electrode line branches, the common electrode line bridges and the data line intersect each other and are insulated from each other.

The common electrode line bridges comprise a first bridge and a second bridge spaced apart and connected in parallel, and the first bridge and the second bridge both are parallel to the gate line.

An interval between the first bridge and the second bridge in a direction parallel to the data line is less than a length of the common electrode line branch.

The first bridge may be disposed close to the common electrode line mainbody.

The second bridge may be disposed at an end of the common electrode line branch.

The common electrode line branches are partially overlapped with the corresponding pixel electrode in an orthogonal projecting direction.

The embodiment of the invention further provides a display device comprising the above described array substrate.

The embodiment of the invention further provides a method for repairing disconnection of data line of the above described array substrate, when an disconnection-point appears in the data line between adjacent pixel electrodes, portions of the data line positioned at both sides of the disconnection-point are connected to the common electrode line bridges, respectively; and the common electrode line branch positioned at one side of the data line is disconnected from the common electrode line bridges, and the common electrode line branch positioned at the other side of the data line is disconnected from the common electrode line mainbody.

The repair method may comprise steps of:

determining a position of the disconnection-point in the data line;

connecting the portion of the data line relatively close to the first bridge, in the portions positioned at both sides of the data line disconnection-point, to the first bridge;

connecting the portion of the data line relatively close to the second bridge, in the portions positioned at both sides of the data line disconnection-point, to the second bridge;

disconnecting the first bridge and the second bridge from the common electrode line branch positioned at the one side of the data line; and disconnecting the common electrode line branch positioned at the other side of the data line from the common electrode line mainbody.

The portions of the data line positioned at both sides of the disconnection-point in the data line may be respectively connected to the first bridge and the second bridge through a laser welding method.

The first bridge and the second bridge may be disconnected from the common electrode line branch positioned at the one side of the data line, and the common electrode line branch positioned at the other side of the data line may be disconnected from the common electrode line mainbody, through a laser cutting method.

According to the array substrate provided by the embodiment of the present invention, by optimizing the common electrode line, not only the overall uniformity of the common electrode voltage Vcom is improved, but also the function for repairing disconnection of the data line is realized, which greatly improves the product yield.

With the corresponding method for repairing disconnection of data line on the array substrate, the product yield is significantly improved, and the production cost is reduced.

The production cost of the display device adopting the above described array substrate is further reduced, and the yield is further improved.

DETAILED DESCRIPTION OF THE EMBODIMENTS

To provide better understanding of the technical solution of the present invention for those skilled in the art, an array substrate, a method for repairing disconnection of data line on the array substrate, and a display device provided by the present invention will be described in detail below with reference to the accompanying drawings and the detailed description of the embodiments.

[First Embodiment]

The present embodiment provides an array substrate, a common electrode voltage Vcom of the array substrate has a good overall uniformity, and the array substrate has a function for repairing disconnection of the data line.

Figure 2:
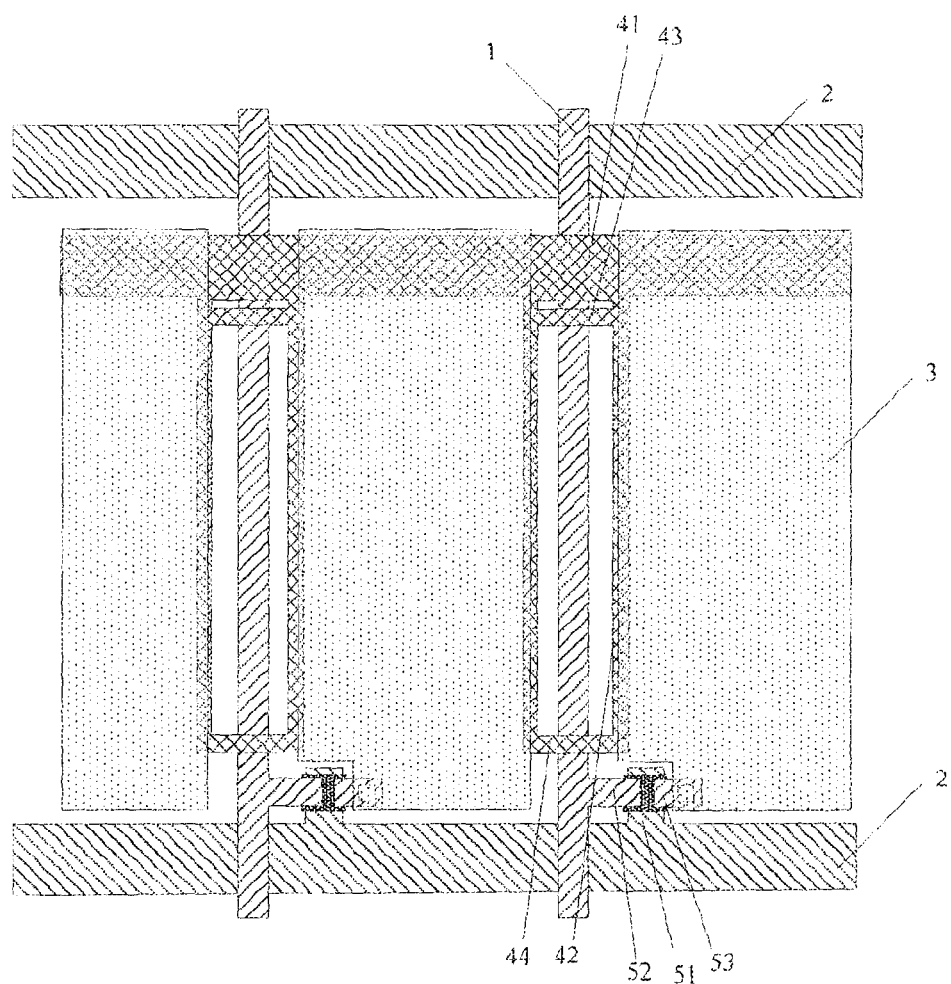
FIG. 2 is a partial structural schematic diagram of an array substrate of the first embodiment of the invention.

FIG. 2 is a partial structural schematic diagram of the array substrate provided by the present embodiment. As shown in FIG. 2, the array substrate is divided into a plurality of pixel regions by data lines 1 and gate lines 2 intersecting each other and insulated from each other, each pixel region is provided with a thin-film transistor and a pixel electrode 3, a gate 51 of the thin-film transistor is connected to the gate line 2, a source 52 of the thin-film transistor is connected to the data line 1, and a drain 53 of the thin-film transistor is connected to the pixel electrode 3. The array substrate further includes a common electrode line. As shown in FIG. 2, the common electrode line includes a common electrode line mainbody 41 parallel to the gate line 2, common electrode line branches 42 extending along a direction of the data line 1 and disposed at both sides of the data line 1, and common electrode line bridges between the common electrode line branches 42, the common electrode line bridges and the data line 1 intersect each other and are insulated from each other.

As shown in FIG. 2, the common electrode line bridges may include a first bridge 43 and a second bridge 44 spaced apart and connected in parallel, and both the first bridge 43 and the second bridge 44 are parallel to the gate line 2. By cooperation of the first bridge 43 and the second bridge 44, not only the resistance value of the common electrode line is reduced, but also the function for repairing disconnection of the data line can be realized.

The interval between the first bridge 43 and the second bridge 44 in the direction parallel to the data line 1 is less than the length of the common electrode line branch 42.

As shown in FIG. 2, the first bridge 43 may be disposed close to the common electrode line mainbody 41, while the second bridge 44 may be disposed at an end of the common electrode line branch 42, so as to maximize the repairing range for disconnection of the data line in the pixel region.

In addition, the common electrode line branches 42 are partially overlapped with the corresponding pixel electrode 3 in an orthogonal projecting direction, to form a storage capacitor.

Figure 1:
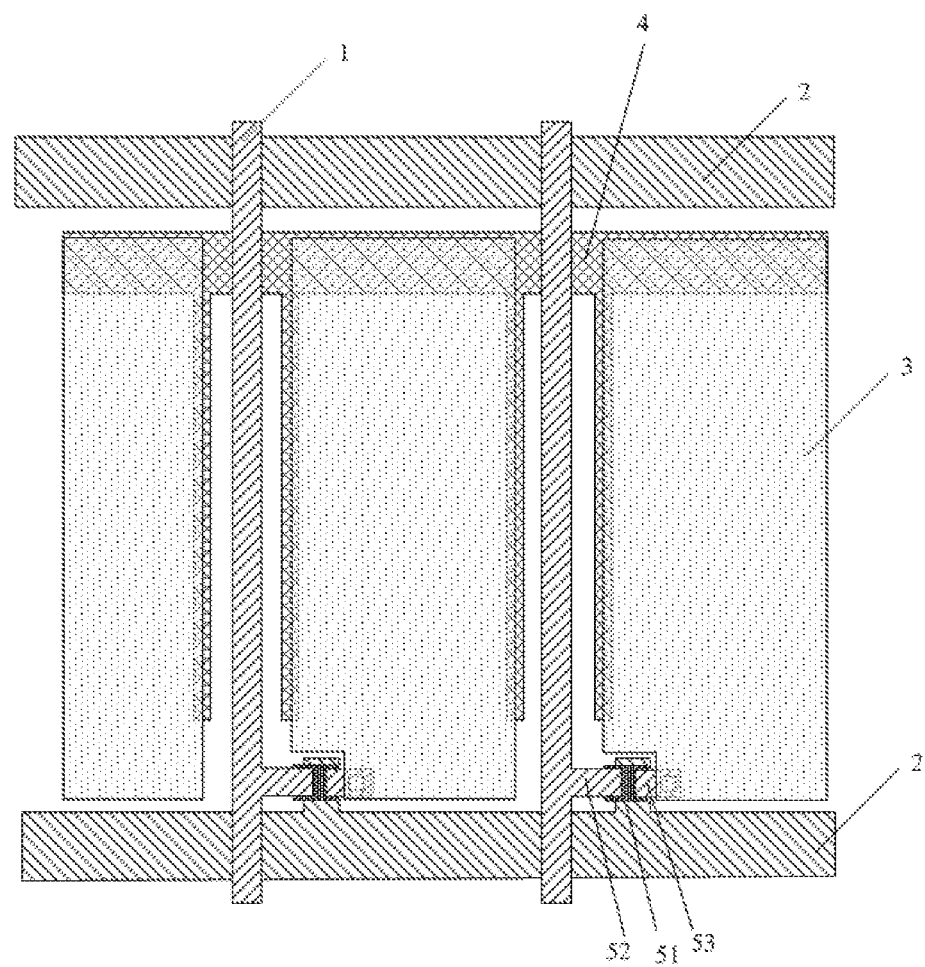
FIG. 1 is a partial structural schematic diagram of the array substrate in the prior art.

In the present embodiment, as shown in FIG. 2, the common electrode line of the array substrate includes an upper portion, a left portion, a right portion, a middle portion and a lower portion, in which the upper portion of the common electrode line is the common electrode line mainbody 41 and is parallel to the gate line 2; the left portion and the right portion are the common electrode line branches 42; the middle portion is the first bridge 43, the lower portion is the second bridge 44, and the middle portion and the lower and upper portions are connected in parallel. Based on the above structure, when compared with the common electrode line of the prior art in FIG. 1, in the present embodiment, the area of the common electrode line is increased, the total resistance is reduced, thereby improving the overall uniformity of the common electrode voltage Vcom. In addition, since the middle portion and the lower portion intersect the data line 1, when the data line 1 between the middle portion and the lower portion is disconnected in somewhere, the data line 1 may be repaired by using the method for repairing disconnection of the data line provided by the embodiment of the invention.

In the array substrate of the present embodiment, by optimizing the common electrode line, not only the overall uniformity of the common electrode voltage Vcom is improved, but also the function for repairing disconnection of the data line is realized, which greatly improve the yield of products. This applies particularly to a TN mode array substrate.

[Second Embodiment]

The present embodiment provides a method for repairing disconnection of the data line based on the array substrate of the embodiment 1. Since the first bridge 43 and the second bridge 44 intersect the data line 1, when the data line 1 between the first bridge 43 and the second bridge 44 is disconnected in somewhere, the data line 1 may be repaired by using a laser repair method.

According to the method, when an disconnection-point appears in the data line 1 between adjacent pixel electrodes 3, portions of the data line 1 positioned at both sides of the disconnection-point are respectively connected to the common electrode line bridges, and the common electrode line branch 42 positioned at a side of the data line 1 is disconnected with the common electrode line bridges, and the common electrode line branch 42 positioned at the other side of the data line 1 is disconnected with the common electrode line mainbody 41.

In particular, the method for repairing disconnection of data line on the array substrate may include steps of:

determining a position of the disconnection-point in the data line 1;

connecting the portion of the data line 1 relatively close to the first bridge 43, in the portions positioned at both sides of the data line disconnection-point, to the first bridge 43;

connecting the portion of the data line 1 relatively close to the second bridge 44, in the portions positioned at both sides of the data line disconnection-point, to the second bridge 44;

disconnecting the first bridge 43 and the second bridge 44 from the common electrode line branch 42 positioned at a side of the data line 1; and disconnecting the common electrode line branch 42 positioned at the other side of the data line 1 from the common electrode line mainbody 41.

Figure 3:
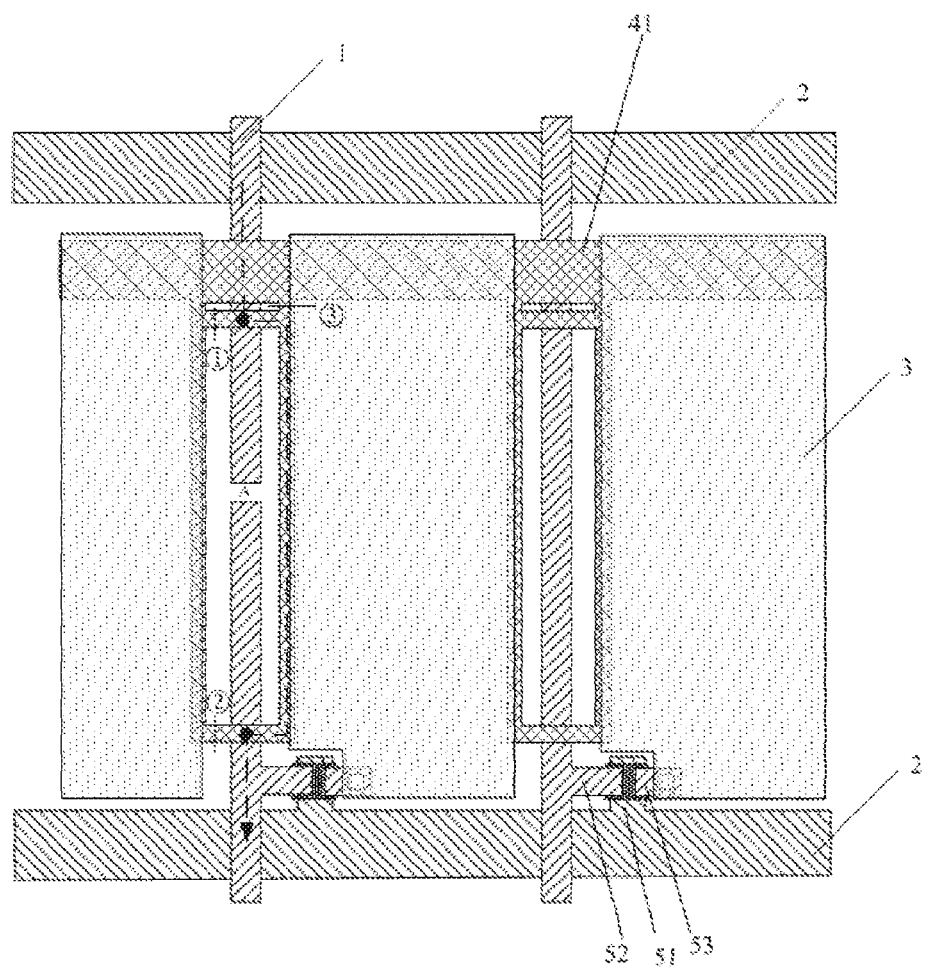
FIG. 3 is a schematic diagram of repairing disconnection of a data line by using the common electrode line in FIG. 2.

FIG. 3 is a schematic diagram of repairing disconnection of the data line using the common electrode line in FIG. 2. As shown in FIG. 3, a data signal path may be established as long as the data line portions at both sides of the disconnection-point A in the data line are respectively connected to the first bridge 43 and the second bridge 44, therefore, the repair may be done in the case where the data line 1 is disconnected at a portion between the first bridge 43 and the second bridge 44.

For example, the portions of the data line 1 positioned at both sides of the disconnection-point in the data line 1 may be connected to the first bridge 43 and the second bridge 44, respectively, through a laser welding method; and the common electrode line branch 42 positioned at a side of the data line 1 may be disconnected from the first bridge 43 and the second bridge 44, and the common electrode line branch 42 positioned at the other side of the data line 1 may be disconnected from the common electrode line mainbody 41, through a laser cutting method.

Hereinafter, the method for repairing disconnection of data line on the array substrate of the present embodiment is described in more detail with reference to FIG. 3. As shown in FIG. 3, when the data line 1 is disconnected at a point A, the portions of the data line 1 positioned at both sides of the point A are respectively welded to the first bridge 43 and the second bridge 44 through a laser welding process at positions of the data line 1 intersecting the first bridge 43 and the second bridge 44 (weld joints are represented by black dots in FIG. 3), and then the common electrode line branch 42 positioned at a side (left side in FIG. 3) of the data line 1 is disconnected from the first bridge 43 and the second bridge 44 through a laser cutting process (breakpoints are represented by black lines ① and ② in FIG. 3), and the common electrode line branch 42 positioned at the other side (right side in FIG. 3) of the data line 1 is disconnected from the common electrode line mainbody 41 through a laser cutting process (breakpoint is represented by black line ③ in FIG. 3). Therefore, the portions of the first bridge 43 and the second bridge 44 positioned at the right side of the weld joints and the common electrode line branch 4 at the right side of the data line 1 serve as a new current transfer path, such that the current bypasses the point A, and the current transfers through the new current transfer path, thereby allowing the pixels controlled by the data line 1 to be normally charged and normally display.

With the method for repairing disconnection of data line on the array substrate, the product yield is significantly improved, and the production cost is reduced.

[Third Embodiment]

The present embodiment provides a display device including the array substrate in the embodiment 1.

On the basis of the array substrate of the first embodiment, according to the method for repairing disconnection of data line on the array substrate provided by the second embodiment, the product yield may be significantly improved, and the production cost of the display device may be reduced.

The display device may be any product or component having display function, such as a liquid crystal panel, an e-paper, a mobile phone, a flat panel computer, a television, a display, a laptop, a digital photo frame, a navigator, etc.

Since the display device adopts the above described array substrate, the production cost is further reduced, and the yield is further improved.

It could be understood that the above embodiments are exemplary embodiments used for describing the principle of the present invention only, but the present invention is not limited thereto. For those skilled in the art, various variations and modifications may be made without departing from the spirit and substance of the present invention, and these variations and modifications are considered as failing within the protection scope of the present invention.

What is claimed is:

1. An array substrate divided into a plurality of pixel regions by data lines and gate lines intersecting each other and insulated from each other, wherein each pixel region is provided with a thin-film transistor and a pixel electrode therein, a gate of the thin-film transistor is connected to the gate line, a source of the thin-film transistor is connected to the data line, and a drain of the thin-film transistor is connected to the pixel electrode, wherein the array substrate further comprises a common electrode line, the common electrode line includes a common electrode line mainbody disposed in parallel to the gate line, common electrode line branches extending along a direction of the data line, directly connecting with the common electrode line mainbody respectively and disposed at both sides of the data line, and common electrode line bridges provided, respectively, between two common electrode line branches, one of which is located at one side of a data line and the other one is located at the other side of the data line, and connected to the two common electrode line branches, the common electrode line bridges and the data line intersect each other and are insulated from each other, and wherein the common electrode line bridges corresponding to a data line comprise a first bridge and a second bridge spaced apart and connected in parallel, and both the first bridge and the second bridge are parallel to the gate line, and wherein the first bridge is close to the common electrode line mainbody and there is a distance between the first bridge and the common electrode line mainbody.

2. The array substrate according to claim 1, wherein an interval between the first bridge and the second bridge in a direction parallel to the data line is less than a length of the common electrode line branch.

3. The array substrate according to claim 2, wherein the first bridge is disposed close to the common electrode line mainbody.

4. The array substrate according to claim 2, wherein the second bridge is disposed at an end of the common electrode line branch.

5. The array substrate according to claim 1, wherein the common electrode line branches are partially overlapped with the corresponding pixel electrode in an orthogonal projecting direction.

6. A display device comprising an array substrate, wherein the array substrate is divided into a plurality of pixel regions by data lines and gate lines intersecting each other and insulated from each other, each pixel region is provided with a thin-film transistor and a pixel electrode therein, a gate of the thin-film transistor is connected to the gate line, a source of the thin-film transistor is connected to the data line, and a drain of the thin-film transistor is connected to the pixel electrode, wherein the array substrate further comprises a common electrode line, the common electrode line includes a common electrode line mainbody disposed in parallel to the gate line, common electrode line branches extending along a direction of the data line, directly connecting with the common electrode line mainbody respectively and disposed at both sides of the data line, and common electrode line bridges provided, respectively, between two common electrode line branches, one of which is located at one side of a data line and the other one is located at the other side of the data line, and connected to the two common electrode line branches, the common electrode line bridges and the data line intersect each other and insulated from each other, and wherein the common electrode line bridges corresponding to a data line comprise a first bridge and a second bridge spaced apart and connected in parallel, and both the first bridge and the second bridge are parallel to the gate line, and wherein the first bridge is close to the common electrode line mainbody and there is a distance between the first bridge and the common electrode line mainbody.

7. The display device according to claim 6, wherein an interval between the first bridge and the second bridge in a direction parallel to the data line is less than a length of the common electrode line branch.

8. The display device according to claim 7, wherein the first bridge is disposed close to the common electrode line mainbody.

9. The display device according to claim 7, wherein the second bridge is disposed at an end of the common electrode line branch.

10. The display device according to claim 6, wherein the common electrode line branches are partially overlapped with the corresponding pixel electrode in an orthogonal projecting direction.

11. A method for repairing disconnection of data line on the array substrate, wherein the array substrate is divided into a plurality of pixel regions by data lines and gate lines intersecting each other and insulated from each other, each pixel region is provided with a thin-film transistor and a pixel electrode therein, a gate of the thin-film transistor is connected to the gate line, a source of the thin-film transistor is connected to the data line, and a drain of the thin-film transistor is connected to the pixel electrode, wherein the array substrate further comprises a common electrode line, the common electrode line includes a common electrode line mainbody disposed in parallel to the gate line, common electrode line branches extending along a direction of the data line, directly connecting with the common electrode line mainbody respectively and disposed at both sides of the data line, and common electrode line bridges between the common electrode line branches, the common electrode line bridges and the data line intersect each other and insulated from each other, wherein the common electrode line bridges comprise a first bridge and a second bridge spaced apart and connected in parallel, and both the first bridge and the second bridge are parallel to the gate line, and wherein the first bridge is close to the common electrode line mainbody and there is a distance between the first bridge and the common electrode line mainbody, the method comprises:

connecting portions of the data line positioned at both sides of an disconnection-point to the common electrode line bridges, respectively, when the disconnection-point appears in the data line between adjacent pixel electrodes; and disconnecting the common electrode line branch positioned at one side of the data line from the common electrode line bridges, and disconnecting the common electrode line branch positioned at the other side of the data line from the common electrode line mainbody.

12. The method for repairing disconnection of data line on the array substrate according to claim 11, the repair method further comprises steps of:

determining a position of the disconnection-point in the data line;

connecting a portion of the data line relatively close to the first bridge, in the portions positioned at both sides of the data line disconnection-point, to the first bridge;

connecting a portion of the data line relatively close to the second bridge, in the portions positioned at both sides of the data line disconnection-point, to the second bridge;

disconnecting the first bridge and the second bridge from the common electrode line branch positioned at the one side of the data line; and disconnecting the common electrode line branch positioned at the other side of the data line from the common electrode line mainbody.

13. The method for repairing disconnection of data line on the array substrate according to claim 12, wherein the first bridge and the second bridge are disconnected from the common electrode line branch positioned at the one side of the data line, and the common electrode line branch positioned at the other side of the data line is disconnected from the common electrode line mainbody, through a laser cutting method.

14. The method for repairing disconnection of data line on the array substrate according to claim 12, wherein an interval between the first bridge and the second bridge in a direction parallel to the data line is less than a length of the common electrode line branch.

15. The method for repairing disconnection of data line on the array substrate according to claim 14, wherein the first bridge is disposed close to the common electrode line mainbody.

16. The method for repairing disconnection of data line on the array substrate according to claim 14, wherein the second bridge is disposed at an end of the common electrode line branch.

17. The method for repairing disconnection of data line on the array substrate according to claim 12, wherein the portions of the data line positioned at both sides of the disconnection-point in the data line are respectively connected to the first bridge and the second bridge through a laser welding method.

18. The method for repairing disconnection of data line on the array substrate according to claim 11, wherein the common electrode line branches are partially overlapped with the corresponding pixel electrode in an orthogonal projecting direction.

* * * * *